United States Patent [19]

Cok

[11] Patent Number: 4,878,231
[45] Date of Patent: Oct. 31, 1989

[54] N-PI PHASE/FREQUENCY DETECTOR

[75] Inventor: Steven P. Cok, Seattle, Wash.

[73] Assignee: John Fluke Mfg. Co., Inc., Everett, Wash.

[21] Appl. No.: 162,455

[22] Filed: Mar. 1, 1988

[51] Int. Cl.⁴ ............................................. H04L 27/14
[52] U.S. Cl. ...................................... 375/80; 375/119; 328/133
[58] Field of Search ................... 375/80, 82, 106, 119, 375/120, 111; 328/130, 140, 155, 133; 307/269, 273; 329/106; 331/17, 18; 455/25, 113

[56] References Cited

U.S. PATENT DOCUMENTS

| | | | |
|---|---|---|---|
| 4,052,672 | 10/1977 | Enderby et al. | 455/113 |
| 4,320,527 | 3/1982 | Takasaki | 328/140 |
| 4,357,707 | 11/1982 | Delury | 307/269 |
| 4,371,974 | 2/1983 | Dugan | 375/82 |
| 4,400,817 | 8/1983 | Sumner | 375/119 |
| 4,535,461 | 8/1985 | Stepp et al. | 375/119 |
| 4,546,331 | 10/1985 | DaSilva et al. | 455/113 |
| 4,554,672 | 11/1985 | Masamura et al. | 375/119 |

Primary Examiner—Robert L. Griffin
Assistant Examiner—Stephen Chin
Attorney, Agent, or Firm—George T. Noe; Stephen A. Becker

[57] ABSTRACT

A digital phase/frequency detector circuit in a phase locked loop comprises multiple bistable devices which are clocked up and down respectively by input and references digital signals to generate square waves. The duty ratio corresponds to the phase/frequency difference and sweeps repetitively between minimum and maximum values as the phase/frequency difference changes monotonically. The square waves are combined logically and additively in the output. The output is integrated to obtain an ever increasing output over many cycles of the phase/frequency difference until the maximum is reached depending on the number of bistable devices which are used. Added circuitry is used to avoid coincidence problems in the clocking input and reference digital signals, to minimize resultant irregularities, and hold the bistable devices at maximum or minimum, as appropriate, until the direction of phase/frequency difference reverses. At either maximum or minimum a sawtooth waveform exists of one magnitude of value out of many magnitudes of value between maximum and minimum. The many magnitudes depend on the number of bistable devices.

9 Claims, 4 Drawing Sheets

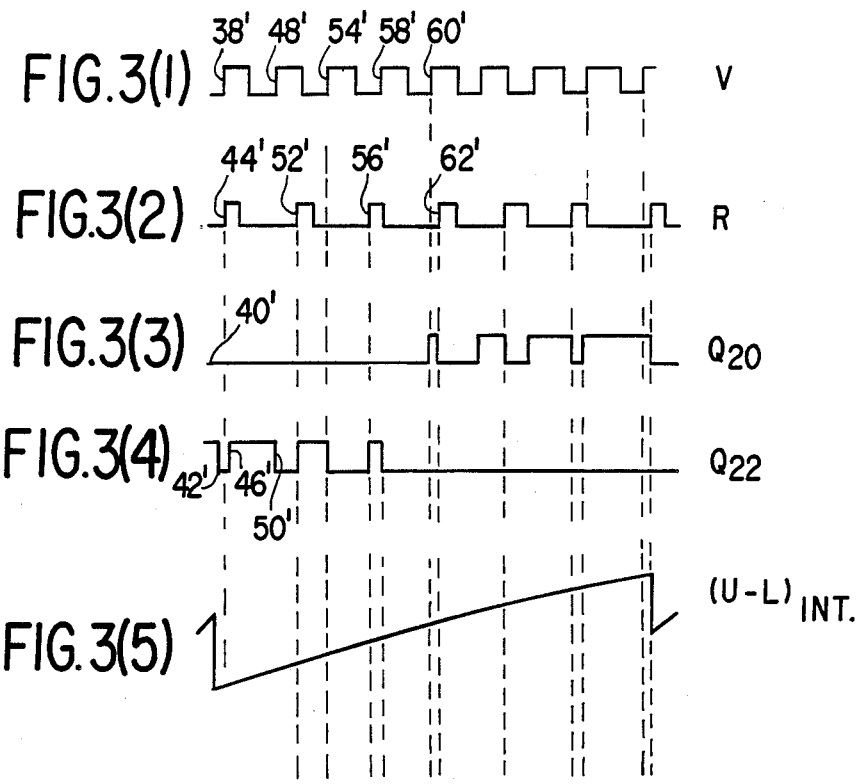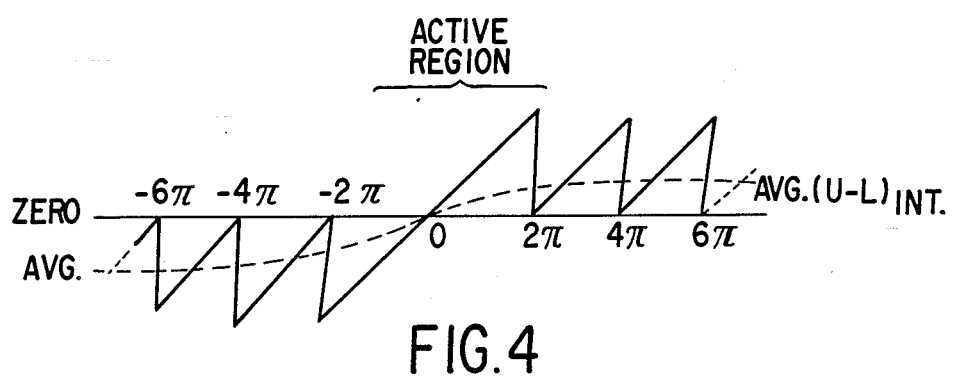
FIG. 4

N-PI PHASE/FREQUENCY DETECTOR

TECHNICAL FIELD

This invention relates generally to circuits for comparing the phase/frequency difference between two digital input signals, and more particularly, toward a method of and circuitry for increasing the linear phase modulation range of a digital phase/frequency detector in a phase locked loop by utilizing circuitry responsive to the maximum range of the detector to provide an output which is additive to the detector output and increases the range a number of more times its original range.

BACKGROUND ART

Circuitry for detecting the difference in phase and frequency between two digital input signals has general utility in signal analysis and is of particular importance in digital communications and frequency synthesis. In a digital phase locked loop, for example, an input signal is applied to a phase detector for comparison with a reference signal. An error signal, which is a function of the instantaneous phase/frequency difference between the input signals, is filtered and applied to control a voltage controlled oscillator (VCO). The output of the VCO, which constitutes the output of the phase locked loop, is applied as the reference signal to the phase detector to cause the phase/frequency of the VCO to "lock" to the phase/frequency of the input signal. In some applications, phase locked loops are used for signal demodulation as discussed in Gardner, Floyd M., *Phase Lock Techniques*, Second Edition, 1979, John Wiley & Sons, Chapter 9. In other applications, phase lock loops are used for signal modulation (Gardner, Chapter 9, supra) or in frequency synthesis as described in Erps et al U.S. Pat. 4,360,788, assigned to the assignee of this invention.

In any case, a conventional digital phase/frequency detector comprises a pair of flip flops or other bistable devices connected together and with a logic gate in a feedback circuit. The logical states of the two flip flops are determined both by the two digital input signals whose frequency/phase difference is to be detected and by the logic gate. With the flip flops initially reset, the data terminals of both are connected to a logic "1" and the clock terminals are connected respectively to the two input digital signals. The output of each flip flop is set to a logic "1" upon detection of a positive transition of its input signal. Thus, if the input signal applied to the first flip flop has the first positive transition the first flip flop is set to a logic "1" and thereafter, the second flip flop, upon a positive transition, by its input signal, becomes set to a logic "1". Immediately after the second flip flop becomes set, however, both of the flip flops are reset by the logic gate which responds to the outputs of the two flip flops, and both remain reset until one flip flop or the other detects a positive signal transition of its input.

The outputs of the two flip flops thus are square waves having duty ratios that correspond to the phase-/frequency difference between the two input signals. If the first signal leads the second signal, only the first flip flop develops a square wave, with the duty ratio corresponding to the amount of phase/frequency lead between the two input signals. If the second input signal leads, only the second flip flop develops a square wave with a duty ratio that corresponds to the amount of phase/frequency lead of the second input signal relative to the first. The two square waves are combined in a difference circuit and the resultant is integrated to obtain a sawtooth centered about zero, that is, the sawtooth has one polarity when the first input signal leads and the opposite polarity when the second input signal leads. The sawtooth has an amplitude that corresponds to the phase/frequency difference between the two digital input signals and has a fixed period of 360°. As the phase/frequency difference between the two input signals increases monotonically, the output of the detector is a sawtooth train having a number of sawtooth cycles that corresponds to the number of full cycles of phase/frequency difference between the two digital input signals.

SUMMARY OF THE INVENTION

A primary object of the invention is, therefore, to provide a method of and circuit for increasing the detection range of a digital phase/frequency detector.

An object is to provide a method of and circuit for increasing the range of the output of a digital phase/frequency detector many times heretofore possible when the phase/frequency difference between the input and reference signals is greater than the predetermined, original value by adding the additional phase/frequency difference to the detector output with additional stages.

Still other objects and advantages of the present invention will become readily apparent to those skilled in this art from the following detailed description, wherein there is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not restrictive.

BRIEF DESCRIPTION OF THE DRAWINGS

FIGS. 3(1)–3(5) are wave forms illustrating the operation of the conventional digital phase/frequency detector of FIG. 2;

FIG. 4 is the output characteristic of the conventional phase/frequency detector of FIG. 2;

PREFERRED EMBODIMENT OF THE PRESENT INVENTION

The invention is designed to increase the linear phase modulation range in a digital phase locked loop of the type described in Erps et al U.S. Pat. No. 4,360,788 and Cok, et al application Ser. No. 105,468 filed Aug. 17, 1987, incorporated within frequency synthesizers manufactured by John Fluke Mfg. Co., Inc., Everett, Washington.

Figure 1:
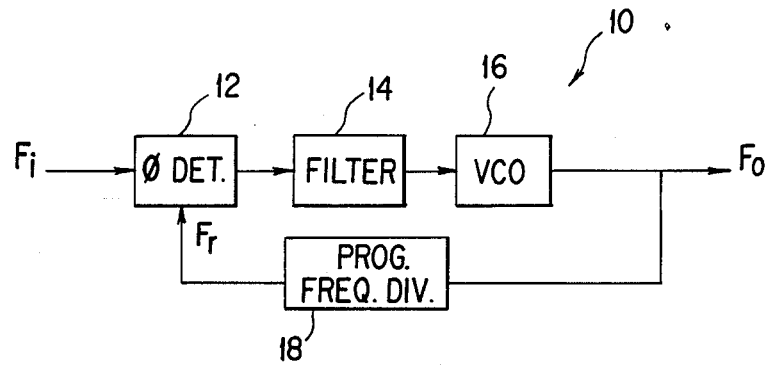
FIG. 1 is a block diagram of a conventional digital phase locked loop of the type within which the frequency/phase detector of the invention may be incorporated.

With reference to FIG. 1, the conventional phase locked loop, designated generally by 10, comprises a phase detector 12 of a type of which the present invention is directed, a filter 14 and a voltage control oscillator (VCO) 16 connected in a forward loop. Phase detector 12 has one input that receives an input signal $F_i$ and a second input that receives a reference signal $F_r$ and generates a signal corresponding to the difference in phase and frequency between the two input signals. The detector signal is filtered or smoothed by filter 14 and applied as a control input to VCO 16. The output of VCO 16, $F_o$, is fed back through programmable frequency divider 18 as the reference signal $F_r$ to phase detector 12. As described in detail in the Erps et al patent, supra, the signal generated by VCO 16 is controlled to have a frequency that is a multiple or submultiple, depending upon the programming of frequency divider 18, of the input signal $F_i$ and a phase having a predetermined relationship, depending upon offset biasing incorporated in detector 12, relative to the phase of the input signal.

It is to be understood that, although a particularly important application of the phase detector of the invention is in a phase locked loop such as the one shown in FIG. 1, the phase detector has numerous other significant applications in signal processing and in signal measurement.

Figure 2:
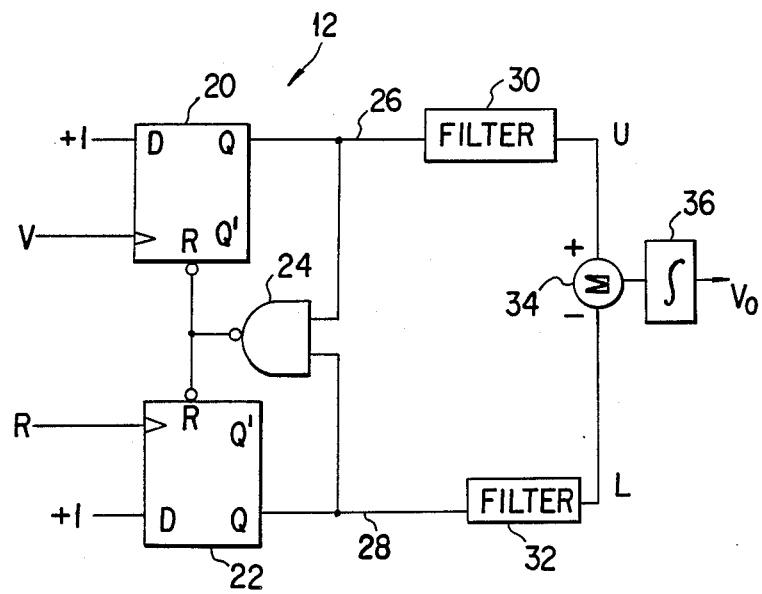
FIG. 2 is a circuit diagram of a conventional digital phase/frequency detector upon which the present invention is an improvement.

The relatively low maximum average output of the conventional phase/frequency detector upon which the invention is an improvement must be fully understood before the present invention can be appreciated. A conventional detector, shown in FIG. 2, comprises a pair of flip flops 20, 22 which for purposes of illustration are shown as D-type flip flops. In a D-type flip flop a logic level applied to the D terminal is transferred to the Q output terminal upon the occurrence of a rising clock pulse applied to the clock terminal. Each D-type flip flop 20, 22 also has a Q' output terminal which develops the logical complement of the Q terminal, and a reset terminal R that, in response to a logic "0" or "low" signal, resets the Q output terminal to a logic "0". For purposes of illustration, the flip flops 20, 22 are assumed to operate on positive logic, i.e., a logical "1" is defined as a "high" voltage and a logical "0" is defined as a "low" voltage.

A NAND gate 24 has two inputs connected respectively to the Q output terminals of flip flops 20, 22 and an output terminal connected to the reset terminals R of the two flip flops. The D input terminal of each of the flip flops 20, 22 is connected to a logic "1" and the two clock terminals are connected respectively to a first variable (input) signal V and a second fixed (reference) signal R. The input signal V may correspond to $F_i$ and input signal R may correspond to signal $F_r$ in FIG. 1, although the two signals V, R may be arbitrary. Also, although both of the signals V, R, are, in the general case, digital or square wave signals having variable and different frequencies and phases, the signal R may be a reference signal having a fixed frequency and phase.

The Q outputs of flip flops 20, 22, designated respectively as 26, 28 are applied to optical filters 30, 32 to develop output signals U, L and then to a summing circuit 34. The output of summing circuit 34 is typically averaged or smoothed in integrator 36. When the detector circuit 12 is applied on a phase locked loop, output integration is performed by the standard phase locked loop filter, such as 14 in FIG. 1.

As an overview of the detector 12, the Q output terminal of each flip flop 20, 22 is set to a logic "1" in response to the positive transition of its input clock caused by either input signal V or input signal R. If both of flip flops 20, 22 are set, however, the output of NAND gate 24 applies a logic "0" level to the reset terminals R of each flip flop, causing both Q output terminals to reset to logic "0". Thus, one or the other of flip flops 20, 22 will be set depending upon which of the input signals V or R has a positive transition that arrives first; both flip flops will become reset upon the arrival of the positive transition of the second one of the input signals V, R. The two flip flops 20, 22 thus generate square waves having duty ratios that correspond to the phase and frequency difference between the two input signals; if input signal V leads input signal R, flip flop 20 dominates and generates a square wave and flip flop 22 does not; if input signal R leads, flip flop 22 dominates and generates a square wave and flip flop 20 does not.

The operation of detector 12, and the manner by which it relates to the improvement, are explained in more detail with reference to FIG. 3 showing typical wave forms generated within the phase detector and to FIG. 4 illustrating the output wave form.

FIG. 3(1) and FIG. 3(2) represent respectively input signals V and R applied to the clock terminals of flip flops 20 and 22. These two input signals are at different frequencies and may have different duty ratios, although duty ratios are of no significance since each flip flop 20, 22 is leading edge responsive. FIGS. 3(3) and 3(4) are output signal wave forms of the signals on lines 26 and 28.

Assume that both flip flops 20, 22 are initially reset by the first positive transition 38' of input signal V whereby the Q outputs of both flip flops 20 and 22 are at logic "0" as shown at 40', 42' in FIGS. 3(3) and 3(4). The next positive transition of input signal R at 44' in FIG. 3(2) causes the output Q terminal of flip flop 22 to set to a logic "1" as shown at 46' in FIG. 3(4). On the occurrence of the next positive transition of input signal V at 48' in FIG. 3(1), the Q output terminal of flip flop 20 begins to set at a logic "1", and gate 24 responds almost immediately to reset both flip flops, driving the Q output of flip flop 22 back to a logic "0" as shown at 50' in FIG. 3(4).

It is apparent that this cycle of events repeats upon the occurrence of the positive transition of input signal R at 52' and of input signal V at 54', and is repeated again on the occurrence of the positive transitions of the R and V input signals at 56' and 58'. During this period of time, flip flop 22, being "dominant" generates a square wave having a duty ratio that decreases with a decreasing phase/frequency difference between the two input signals R and V, and that the output of the other flip flop 20 is at a logic "0".

After the occurrence of the positive transition of input signal V at 60', however, the frequency of pulses applied to the clock terminal of flip flop 20 is such that there will be two pulses, one having a positive transition at 58' and the next pulse having a positive transition at 60' before the occurrence of the next pulse by input signal R at positive transition 62'. The effect of the second successive pulse at 60' is to now set the output of flip flop 22 to a logic "1" since both flip flops 20, 22 were previously reset prior to positive pulse transition 60'. Subsequently, positive transition of input signal R at 62' will reset the Q output of flip flop 20, and the sequence continues with flip flop 20 enabled and flip flip 22 disabled as shown in FIGS. 3(3) and 3(4). The sequence will eventually recycle as the phase and frequency difference between the input signals V and R changes, with one of the flip flops always being enabled and generating a square wave having a duty ratio that corresponds to the phase/frequency difference and the other flip flop being disabled. Which of the two flip flops 20, 22 is the enabled one at any time depends upon which one of the input signals V, R leads.

As mentioned, the output lines 26, 28 of flip flops 20, 22 are passed through optical low pass filters 30, 32 to difference circuit 34 whose output is averaged or smoothed by integrator 36.

The difference signal, smoothed by 36, is a sawtooth shown in FIG. 3(5) that passes through "0" when "dominance" is transferred between flip flop 20 and 22 as shown in the region illustrated by FIGS. 3(1)–3(4) and is repetitive with a period of a full cycle (2 pi) of phase/frequency as shown in FIG. 4. When two input signals V and R are within a positive and negative single cycle of being synchronized to each other or "locked", the detector characteristic is said to be in the "active region" as shown in FIG. 4. When the two input signals are outside the active region, the phase detector 12 generates a sawtooth having a maximum average signal (see dotted lines in FIG. 4) that has a magnitude of one-half the peak magnitude of the sawtooth and a polarity that depends upon which of the two signals leads.

Figure 5:
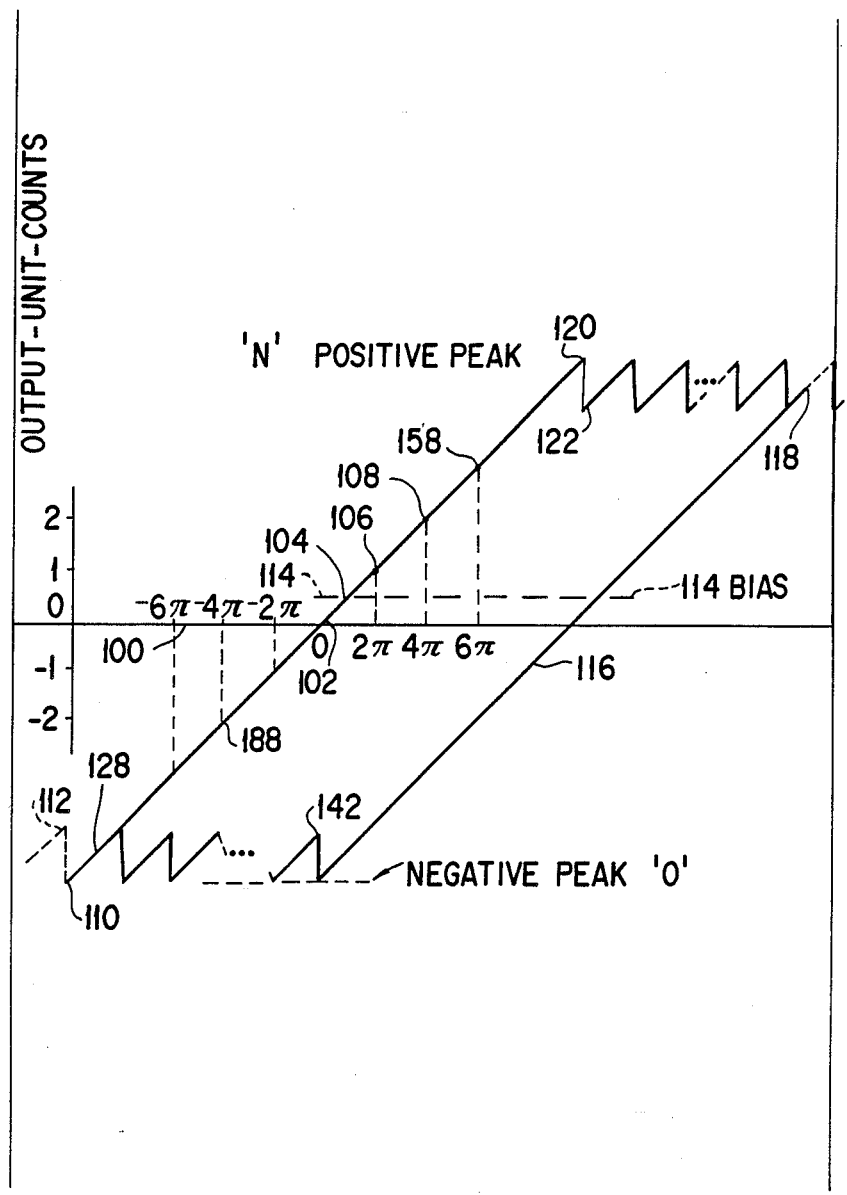
FIG. 5 is the desired characteristic of the digital phase/frequency detector improved in accordance with the principles of the invention.

Referring now to FIG. 5 therein is shown the desired characteristic output of the digital phase/frequency detector as contrasted to the output shown in FIG. 4 for a conventional detector. In FIG. 5, the zero axis 100 defines the zero current level. Assume a bipolar output. The zero horizontal point 102 defines the arbitrary starting point at which the input signal V matches the phase of the reference signal R. Proceeding right from point 102, input signal V will lead reference signal R and conversely to the left of zero point 102 the input signal V will lag the reference signal R.

As the phase difference is increased between input signal V and reference signal R the current will increase up the slope 104 to reach the normal output level 106. There is a slight irregularity around the 2 pi normal output point 106, as will be described herein later, and then the current increases to the output point 108 at the 4 pi point which is twice the normal output 106 level. The action is repeated every 2 pi, 4 pi, 6 pi, etc. As the phase difference increases beyond maximum N, there is a discontinuity which causes the current to drop from the peak output level 120 to the output level 122. As the phase difference continues to increase, the current will again begin to increase towards the peak output level 120 and will repeat indefinitely every 2 pi.

Similarly, in examining the situation where the input signal V lags the reference signal R, the digital phase/frequency detector will operate in the same manner in that the current will increase in a negative direction 188 until the negative output peak output level 110 is reached at which point there will be a discontinuity as the phase difference increases to cause the current level to drop back down to the zero level 112.

There would be a tendency for discontinuities to exist at the zero level 100 and at every multiple of 2 pi of phase/frequency difference. Circuitry to eliminate the discontinuities and to reduce the irregularities will be presented later.

Since the electronic components in the detector do not operate in an ideal fashion, consider those irregularities which appear at the output level 106 and at the zero level 100. In order to avoid operating continuously at any of these points, it is desired that the operating level of the detector be set away from these points, and in the preferred embodiment it is set at the operating level 114. In the preferred embodiment, this operating level 114 is selected to be halfway between the zero output level 100 and the level 106 which is approximately centered between positive and negative peaks.

With the selected level in the preferred embodiment, it is possible to get the maximum range out of the phase/frequency detector in both leading and lagging phase relationships for system phase modulation. A further advantage is that by placing the operating level as far away from the discontinuities and irregularities as possible which is halfway between the percentage distortion becomes a small portion of a fairly large phase deviation.

Figure 6:
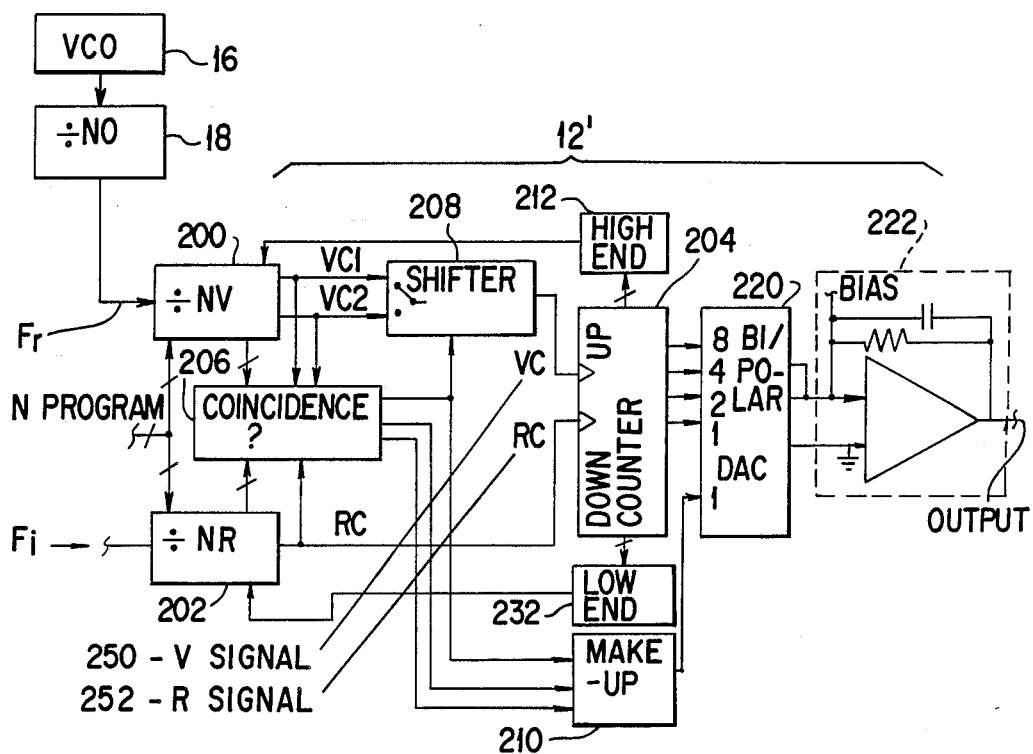
FIG. 6 is the block diagram of the present invention

Referring now to FIG. 6 wherein the flip flops 20, 22 have been replaced by conventional up/down counter 204, coincidence circuits 206, shifter circuit 208, make-up circuit 210 and high and low end circuits 212, 232. There are many configurations these circuits can take as would be evident to those skilled in the art from the following descriptions of how they operate. Currents are shown being programmed by the up/down counter 204, generated in the dac (digital to analog converter) 220, and filtered in the operation amplifier 222.

Additional dividers NV 200 and NR 202, which may equal divide-by-one or greater, add flexibility in choosing the corrector phase detector signal frequencies V 250 and R 252. The dividers 200, 202 also are used to determine coincidence and hold the up/down counter 204 at either maximum or minimum.

The up/down counter 204 has uncertain operation at coincident occurrences of the up and down signals V 250 and R 252. Therefore as the V and R signals approach coincidence the shifter circuit 208 prevents coincidence problems and the make-up circuit 210 minimizes the irregularities of shifting.

The output of the DAC 220 is integrated and filtered in the following operational amplifier 222.

Referring now to FIGS. 5 and 6, the operation of the detector 12' incorporating the present invention will be explained in terms of the output, FIG. 5. The operation of the detector 12' where the frequency V 250 leads the frequency R 252 by less than 2 pi is substantially the same as for the conventional detector 12. The up/down counter 204 alternates between a count of n and n+1 and has the same duty ratio as the conventional detector. The following discussion will focus on the area where the phase difference approaches 2 pi or multiples of 2 pi.

As the difference approaches 2 pi, FIG. 5 point 106, the duty ratio of the n, n+1 output cycle of the up/down counter 204 approaches 100%. As the n, n+1 duty ratio approaches 100% the coincidence circuit 206 is set to indicate a near coincidence condition. This set causes the time shifter circuit 208 to shift the V signal away from coincidence and also causes a make-up circuit 210 pulse to fill in for the shifted time. As the phase difference continues through 2 pi and passes 2 pi, the coincidence circuit 206 resets and restores the shifter circuit 208 to the original time and removes the make-up circuit 210 pulse and at the same time advancing the count of the up/down counter 204, by one, to an n+1, n+2 alternating sequence of now small duty ratio. Operation now normally continues up until a high duty ratio of n+1, n+2, FIG. 5 point 108. The coincidence process is repeated again, and repeated again and again until n+x, n+x+1 count reaches maximum N of the up/down counter 204.

As the up/down counter 204 approaches maximum, the high end circuit 212 prevents the up/down counter 204 from wrapping around to return to zero but holds the maximum count minus one alternating between N−1 and N with a varying duty cycle which produces the sawtooth wave form, FIG. 5 points 120, 122, 118.

This discussion started from above an arbitrary phase zero point, FIG. 5 point 100, with an n, n+1 count, tracing the operation in an increasing direction as V was leading R, and it can be just as easily shown that as the phase difference approaches zero and the duty ratio approaches zero, that the coincidence circuit 206, shifter circuit 208, and make-up circuit 210 perform in a similar fashion to eliminate the coincidence problems and minimize irregularities. For less than zero phase difference, the up/down counter 204 then alternates between an n−1 and n count.

As the phase difference of V lags R by 2 pi or multiples of 2 pi the coincidence action continues and reduces the count by one from n−1, n to n−2, n−1 and repeats until the up/down counter 204 is at minimum at which time the low end circuit 232 holds the up/down counter 204 from wrapping around to maximum. This produces a sawtooth waveform, FIG. 5 points 110 to 142 which is a function of the frequency difference of V 250 minus R 252.

These sawtooth waveforms continue at either end of the counter count in the appropriate direction, positive direction for the frequency V greater than R and the up/down counter 204 at maximum, or negative direction for frequency of V less than R and the up/down counter 204 at minimum. However, when the frequency direction changes at either end count the return is a smooth transition to a slope. This action traces out the shape of FIG. 5 points 100, 120, 122, 118, 116, 142, 128, 100. The frequency changes are at points 118 and 128, in FIG. 5.

In this disclosure, there is shown and described only the preferred embodiment of the invention, but as before mentioned, it is to be understood that the invention is capable of use in various other combinations and environments and is capable of changes or modifications within the scope of the inventive concept as expressed herein. For example, it would be possible to cascade additional flip flops so as to provide increased range by duplicating the characteristic above the zero level 100 equally in the negative direction. Further, as would be apparent to those skilled in the art, additional states could be added where desired to further increase the range by using a similar approach as to that disclosed herein.

What is claimed is:

1. A digital phase/frequency detector circuit for detecting differences in phase and frequency between an input signal and a reference signal, comprising:
   means for receiving the input and reference signals;
   means for generating different value square wave signals having a duty ratio corresponding to a phase and frequency difference between said input and reference signals;
   means for adding together said square wave signals to provide a resultant square wave signal of unique values as said phase and frequency difference exceeds predetermined particular difference values;
   means for integrating said resultant square wave signal to provide a corresponding sawtooth wave signal which extends over plural sawtooth cycles; and
   means responsive to said sawtooth wave signal to provide an output signal representative of said phase and frequency difference.

2. A digital phase/frequency detector circuit for detecting differences in phase and frequency between an input signal and a reference signal, comprising:
   means for receiving the input and reference signals;
   means for generating square waves having a duty ratio corresponding to a phase and frequency difference between said input and reference signals;
   means for integrating said square waves to provide corresponding sawtooth wave signals;
   means for adding together said sawtooth wave signals to provide a summed sawtooth wave signal when said phase and frequency difference exceeds a predetermined value; and
   means responsive to said summed sawtooth wave signal to provide an output signal representive of said phase and frequency difference.

3. The circuit of claim 2, wherein said means for receiving includes first and second divider circuits receiving respectively said input signal and said reference signals.

4. The circuit of claim 2, wherein said means for integrating includes an up-down counter circuit and a digital-to-analog converter circuit responsive to said counter circuit for generating said sawtooth wave signals.

5. The circuit of claim 4, wherein said means to provide an output signal includes an amplifier circuit responsive to an output of said converter circuit.

6. The circuit of claim 5, including means for establishing an operating point of said amplifier circuit that is displaced from discontinuities of said sawtooth wave signals.

7. The circuit of claim 3, including correction circuitry for eliminating discontinuities of the output signal at phase and frequency differences between said input and reference signals of multiples of $2\pi$.

8. The circuit of claim 7, wherein said correction circuitry includes coincidence detecting means for detecting coincidence between signal transitions at outputs of said first and second divider circuits, a time shifter circuit responsive to said coincidence detecting means for time shifting the signal at an output of one of said first and second divider circuits to cause the output signals of said first and second divider circuits to become non-coincident and make-up circuit means for generating compensating pulses corresponding to said output time shifting by said time shifter circuit.

9. A method for detecting differences in phase and frequency between an input signal and a reference signal, comprising the steps of:
   receiving the input and reference signals;
   generating square waves having a duty ratio corresponding to a phase and frequency difference between said input and reference signals;
   integrating said square waves to provide corresponding sawtooth wave signals;
   adding together said sawtooth wave signals to provide a summed sawtooth wave signal when said phase and frequency difference exceeds a predetermined value; and
   responding to said summed sawtooth wave signal to provide an output signal representative of said phase and frequency difference.

* * * * *